United States Patent
Dehe

(10) Patent No.: US 9,487,386 B2
(45) Date of Patent: Nov. 8, 2016

(54) COMB MEMS DEVICE AND METHOD OF MAKING A COMB MEMS DEVICE

(71) Applicant: Infineon Technologies AG, Neubiberg (DE)

(72) Inventor: Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/743,306

(22) Filed: Jan. 16, 2013

(65) Prior Publication Data

US 2014/0197502 A1   Jul. 17, 2014

(51) Int. Cl.
*B81B 3/00* (2006.01)
*B81C 1/00* (2006.01)

(52) U.S. Cl.
CPC ............ *B81B 3/0005* (2013.01); *B81B 3/001* (2013.01); *B81C 1/0015* (2013.01); *B81B 2203/0136* (2013.01)

(58) Field of Classification Search
None
See application file for complete search history.

(56) References Cited

U.S. PATENT DOCUMENTS

| | | | |
|---|---|---|---|
| 6,000,280 A * | 12/1999 | Miller et al. | 73/105 |
| 6,074,890 A * | 6/2000 | Yao et al. | 438/52 |
| 6,461,888 B1 * | 10/2002 | Sridhar | B81C 1/0015 438/50 |
| 6,771,001 B2 * | 8/2004 | Mao et al. | 310/309 |
| 7,040,173 B2 | 5/2006 | Dehe | |
| RE40,781 E | 6/2009 | Johannsen et al. | |
| 7,545,945 B2 | 6/2009 | Miles | |
| 7,882,612 B2 | 2/2011 | Dehe et al. | |
| 7,923,792 B2 | 4/2011 | Schrank | |
| 2003/0048036 A1 * | 3/2003 | Lemkin | 310/309 |
| 2005/0132805 A1 * | 6/2005 | Park | G01P 15/125 73/514.32 |
| 2006/0145793 A1 * | 7/2006 | Ning et al. | 335/78 |
| 2008/0105951 A1 * | 5/2008 | Sato et al. | 257/619 |
| 2009/0267445 A1 * | 10/2009 | Mizuno et al. | 310/300 |
| 2010/0124343 A1 | 5/2010 | Zhang | |
| 2010/0294041 A1 * | 11/2010 | Tai et al. | 73/718 |
| 2011/0030472 A1 * | 2/2011 | Aziz | B81B 3/0062 73/504.12 |
| 2011/0063068 A1 * | 3/2011 | Zhang | B81B 3/0024 337/35 |
| 2012/0139065 A1 | 6/2012 | Van Beek et al. | |
| 2012/0248554 A1 | 10/2012 | Klein et al. | |
| 2013/0194649 A1 * | 8/2013 | Zhou | 359/230 |

FOREIGN PATENT DOCUMENTS

| | | |
|---|---|---|
| CN | 101778697 A | 7/2010 |
| DE | 10144847 | 3/2003 |
| DE | 102006001493 | 7/2007 |
| EP | 2460762 A1 | 6/2012 |
| EP | 2505548 A2 | 10/2012 |
| JP | 2007159389 A | 6/2007 |
| JP | 2012220531 A | 11/2012 |

* cited by examiner

*Primary Examiner* — Whitney T Moore
*Assistant Examiner* — Scott R Wilson
(74) *Attorney, Agent, or Firm* — Slater Matsil, LLP

(57) ABSTRACT

A MEMS device and a method to manufacture a MEMS device are disclosed. An embodiment includes forming trenches in a first main surface of a substrate, forming conductive fingers by forming a conductive material in the trenches and forming an opening from a second main surface of the substrate thereby exposing the conductive fingers, the second main surface opposite the first main surface.

30 Claims, 16 Drawing Sheets

US 9,487,386 B2

COMB MEMS DEVICE AND METHOD OF MAKING A COMB MEMS DEVICE

TECHNICAL FIELD

The present invention relates generally to a comb MEMS device and a method for making a comb MEMS device. In particular embodiments, the invention relates to a silicon comb microphone.

BACKGROUND

Over the past years a desire for smaller electronic form factors, smaller power consumption and increased performance has driven an integration of MEMS devices. In particular, MEMS microphones may become smaller and smaller because electronic devices such as, e.g., cell phones, laptops, and tablets become smaller and smaller.

SUMMARY OF THE INVENTION

In accordance with an embodiment of the present invention, a method for making a MEMS device comprises forming trenches in a first main surface of a substrate, forming conductive fingers by forming a conductive material in the trenches and forming an opening from a second main surface of the substrate thereby exposing the conductive fingers, the second main surface being opposite the first main surface.

In accordance with an embodiment of the present invention, a MEMS device comprises a stator comprising a first set of fingers, a movable element comprising a second set of fingers, wherein the first set of fingers and the second set of fingers are interdigitated and an anti-sticking mechanism between the first set of fingers and the second set of fingers.

In accordance with an embodiment of the present invention, a method of forming a MEMS device comprises forming trenches in a first main surface of a substrate, the trenches being spaced apart by rims and forming an insulating layer on bottom surfaces and sidewalls of the trenches. The method further comprises forming first conductive fingers in the trenches, replacing the rims with second conductive fingers and forming an opening from a second main surface of the substrate thereby exposing the first conductive fingers and the second conductive fingers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a silicon comb microphone. The invention may also be applied, however, to other microphones and MEMS devices.

Standard condenser microphones comprise a parallel plate capacitance. A change in distance (gap) between a membrane (the first plate) and a backplate (second plate) measures an incoming sound signal. Based on this construction air moves through the perforations in the backplate an unavoidable generates noise and, therefore, limits signal to noise ratio improvement.

Embodiments of the invention provide comb MEMS devices. Further, embodiments of the invention provide comb MEMS devices having an anti-sticking mechanism such as an anti-sticking layer or an anti-sticking structure on the stator and/or movable element fingers. Further embodiments provide methods to manufacture a comb MEMS device with an anti-sticking mechanism.

Figure 1A:
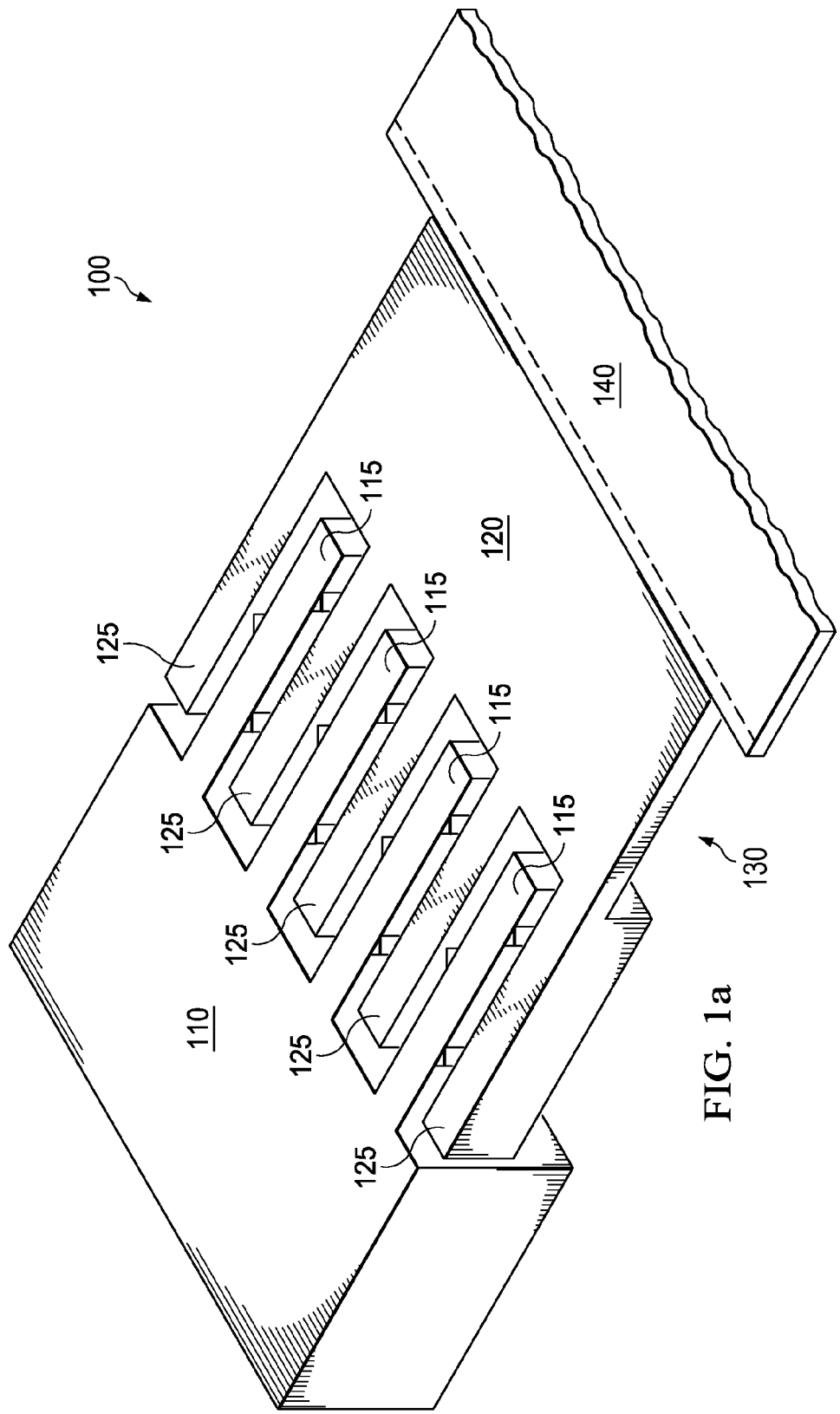
FIG. 1a shows an embodiment of a MEMS device.

FIG. 1a shows a perspective view of an embodiment of a MEMS device 100. The MEMS device 100 comprises a stator 110, a movable electrode such as a membrane (or diaphragm) 120, an opening or cavity 130 beneath the membrane 120 and a support 140. In some embodiments the movable electrode 120 comprises a cantilever. The membrane 120 comprises membrane fingers 125 and the stator 110 comprises stator fingers 115. The membrane fingers 125 and the stator fingers 115 are interlocked or interdigitated. The membrane fingers 125 and the stator fingers 115 are arranged such that two membrane fingers 125 are the outermost fingers or two stator fingers are the outermost fingers.

The membrane fingers 125 and the stator fingers 115 are configured to move vertical against each other thereby generating an electrical signal which can be measured. Under normal operation, the membrane fingers 125 move relative to the stator fingers 115 and don't touch each other.

In various embodiments, the membrane fingers 125 and/or the stator fingers 115 may comprise an anti-sticking coating so that the membrane fingers 125 and the stator fingers 115 do not stick to each other even when the fingers 115, 125 touch each other due to collapse, humidity or dirt.

Figure 1B:
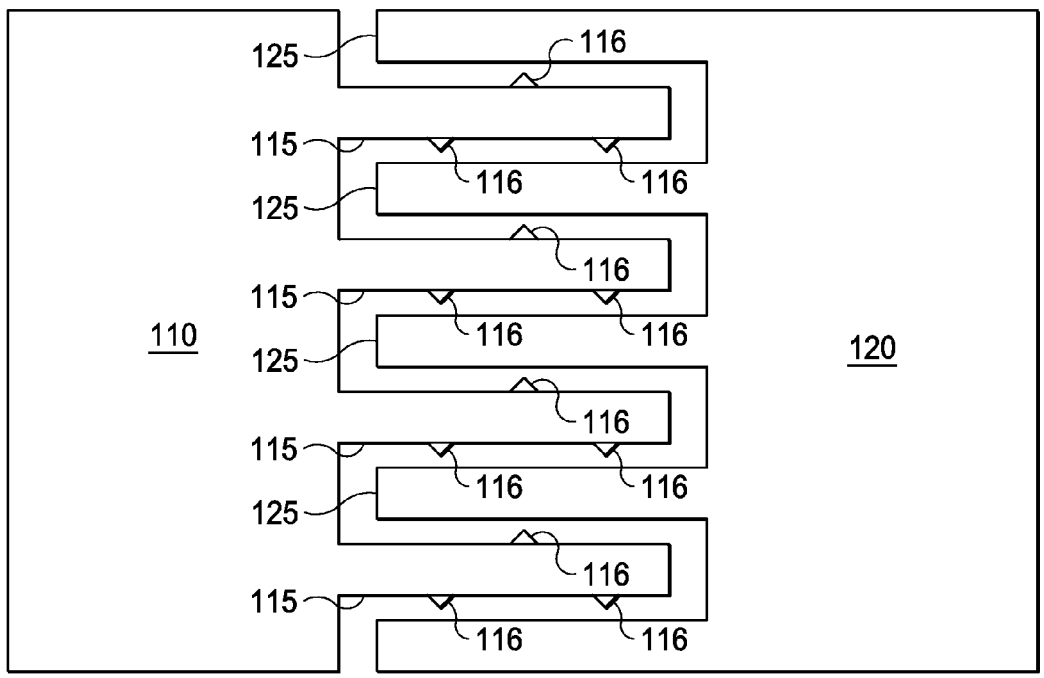
FIG. 1b shows a top view of interlocked or interdigitated conductive fingers.

In other embodiments the membrane fingers 125 and/or the stator fingers 115 comprise anti-sticking structures 116 as shown in FIG. 1b. In various embodiments, the anti-sticking structures 116 are arranged at the stator fingers 115. In alternative embodiments the anti-sticking structures 116 are arranged at the membrane fingers 125. In yet other embodiments the anti-sticking strictures 116 are disposed on the stator fingers 115 and the membrane fingers 125. The anti-sticking structures 116 may be anti-sticking bumps protruding out from a finger 115, 125 towards a neighboring finger 115, 125 or each neighboring finger 115, 125. The anti-sticking structures are configured to prevent stiction of the fingers 115, 125.

The MEMS devices 100 may comprise a sound transducer such as a microphone. Alternatively, the MEMS device 100 may comprise other transducers. For example, another transducer may be a sensor such as a pressure sensor, an accelerometer or a RF MEMS. The MEMS device 100 may be a stand-alone device or alternatively may comprise additional circuit elements such as a pre-amplifier and input/output terminals. The MEMS device 100 may comprise an integrated circuit comprising for example an A/D converter and/or a plurality of transistors.

Figure 2:
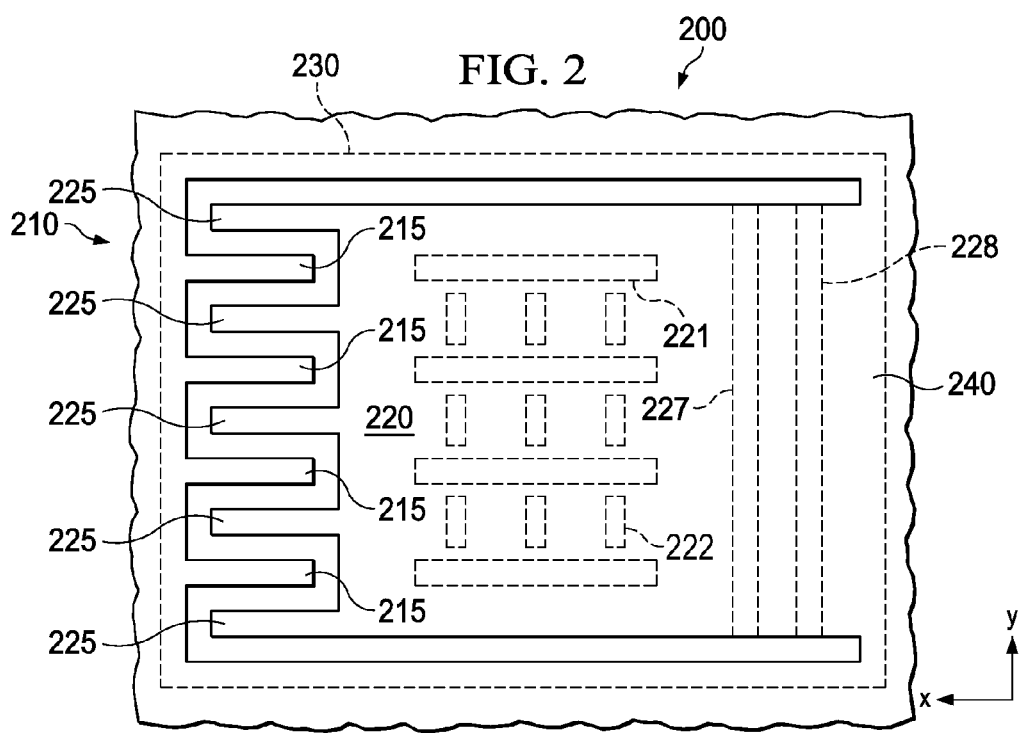
FIG. 2 shows another embodiment of a MEMS device.

FIG. 2 shows a top view of an embodiment of a MEMS device 200. The MEMS device 200 comprises a stator 210, a membrane 220, an opening or cavity 230 beneath the membrane 220 and a support 240. The membrane 220 is movably connected to the support 240. The membrane 220 comprises membrane fingers 225 and the stator 210 comprises stator fingers 215. The membrane fingers 225 and/or the stator fingers 215 may comprise an anti-sticking coating and/or anti-sticking structure so that the membrane fingers 225 and the stator fingers 215 do not stick to each other.

The membrane fingers 225 and/or the stator fingers 215 may be conductive. In an embodiment, the membrane fingers 225 and/or the stator fingers 215 may comprise a conductive material. In an embodiment, the conductive material may comprise a metallic material. For example, the metallic material may comprise a pure metal, an alloy and/or a compound. It is understood that any pure metal may include some amount of trace impurities. In an embodiment, the conductive material may comprise a non-metallic material. In an embodiment, the conductive material may comprise a conductive polymer. In an embodiment, the conductive material may comprise a semiconductor material. For example, the semiconductor material may be a doped semiconductor material such as doped silicon. The doped semiconductor material may, for example, be in situ doped. The doped silicon may, for example, comprise a doped monocrystalline silicon and/or a doped polycrystalline silicon. Hence, in an embodiment, the conductive material may comprise a polycrystalline silicon such as a doped polycrystalline silicon.

In an embodiment, the membrane fingers 225 and/or the stator fingers 215 may comprise a semiconductor material. The semiconductor material may be a doped semiconductor material or an undoped semiconductor material. The semiconductor material may comprise silicon. The silicon may comprise monocrystalline silicon and/or polycrystalline silicon. In an embodiment the stator fingers 215 and the membrane fingers 225 comprise the same material. In an embodiment, the stator fingers 215 and the membrane fingers 225 may comprise a different material.

In an embodiment, the membrane fingers 225 and/or the stator fingers 215 may further comprise dielectric layers. For example, the membrane fingers 225 and/or the stator fingers 215 may comprise a conductive layer sandwiched between two dielectric layers or a dielectric layer sandwiched between two conductive layers. Hence, in an embodiment, the membrane fingers and/or the stator fingers may comprise an alternating arrangement of conductive layers and dielectric layers. The conductive layers may comprise any conductive material such as the conductive materials described above. The membrane 220 may further comprise corrugation lines 221, 222. The corrugation lines 221, 222 may be configured to stiffen the inner region of the membrane 220. The membrane 220 may comprise only corrugation lines 221 along an x-direction or only corrugation lines 222 along a y-direction. Alternatively, the membrane 220 comprises corrugation lines 221, 222 in x- and in y-direction (e.g., forming a criss-cross pattern). In one or more embodiments, the corrugation lines 221, 222 may be replaced with other forms of elongated protrusions such as ridges, e.g., areas where one surface is flat and the opposite surface is elevated. The MEMS device 200 (e.g., the membrane 220) may further comprise corrugation lines 227, 228. The corrugation lines 227, 228 may be disposed in a peripheral region of the membrane 220. The corrugation lines 227, 228 may make the membrane 220 more flexible and easier to move.

Figure 3:
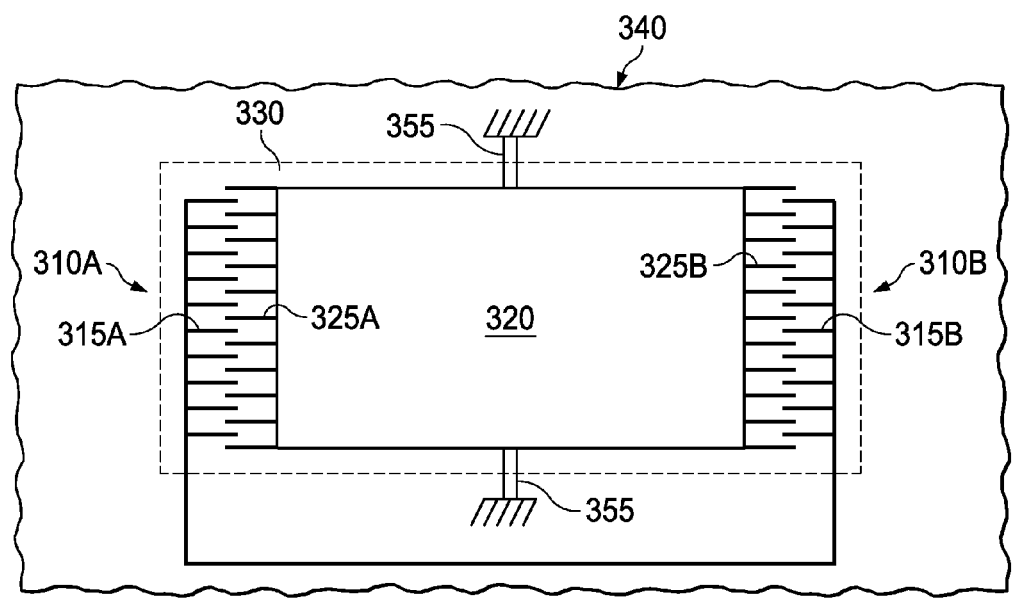
FIG. 3 shows yet another embodiment of a MEMS device.

FIG. 3 shows a top view of yet another embodiment of a MEMS device 300. The MEMS device 300 comprises two stators 310A, 310B, a membrane 320, an opening or cavity 330 beneath the membrane 320 and a support 340. The membrane 320 comprises a first set of fingers 325A on a first side and a second set of fingers 325B on a second side. Similarly, the first stator 310A comprises a first set of fingers 315A and the second stator 310B comprises a second set of fingers 315B. The first and second set of membrane fingers 325A, 325B, and/or the first and second set of stator fingers 315A, 315B may comprise an anti-sticking coating and/or anti-sticking structures so that the membrane fingers 325A, 325B and the stator fingers 315A, 315B do not stick together. The membrane 320 may be anchored 355 at two side surfaces to the support 340. The anchors 355 may comprise a spring support. The anchor 355 comprising a spring support may be configured to operate in a torsional mode. The spring support may comprise polysilicon. In one embodiment the membrane 320 may comprise corrugation lines or ridges in x-direction and/or y-direction. In a further embodiment the membrane 320 may comprise one or more corrugation lines in a peripheral region of the membrane, the one or more corrugation lines configured make the membrane 320 more flexible.

An advantage of this embodiment may be that a phase difference proportional the direction of the sound signal can be detected. For example, if a sound signal hits the top surface of the membrane 320 from a direction which has an angle or is titled relative to a normal of that top surface the membrane ends 320A, 320B deflect differently and the MEMS device 300 can detect the phase difference.

Figure 4:
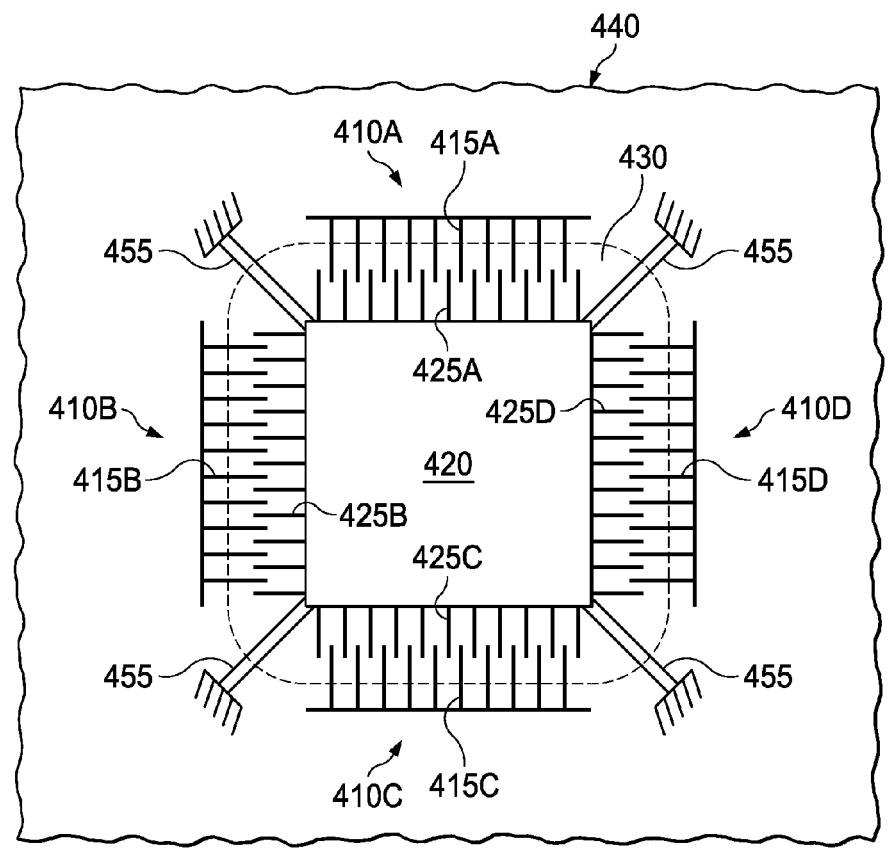
FIG. 4 shows a further embodiment of a MEMS device.

FIG. 4 shows a top view of another embodiment of a MEMS device 400. The MEMS device 400 comprises four stators 410A, 410B, 410C, 410D, a membrane 420, a cavity or opening 430 beneath the membrane 420. The membrane 420 comprises a first set of fingers 425A on a first side, a second set of fingers 425B on a second side, a third set of fingers 425C on a third side, and a fourth set of fingers 425D on a fourth side. Similarly, the first stator 410A comprises a first set of fingers 415A, the second stator 410B comprises a second set of fingers 415B, the third stator 410C comprises a third set of fingers 415C and the fourth stator 410D comprises a second set of fingers 415D. The sides of the membrane 420 may comprise the same length or a different length. The number of fingers on the sides may be the same or different between two sides.

The membrane fingers 425A, 425B, 425C, 425D and/or the stator fingers 415A, 415B, 415C, 415D comprise an anti-sticking coating and/or anti-sticking structures so that the membrane fingers 425A, 425B, 425C, 425D and the stator fingers 415A, 415B, 415C, 415D do not stick to each other. The membrane 420 may be anchored 455 at the four corners of the membrane 420 to the support 440. The anchors 455 may comprise a spring support. The spring support may be a polysilicon.

The membrane 420 may comprise corrugation lines or ridges in x-direction and/or y-direction. In a further embodiment the membrane 420 may comprise one or more corrugation lines in a peripheral region of the membrane, the one or more corrugation lines configured make the membrane 420 more flexible. The membrane 420 may comprise a square, a rectangle, a circle or an oval. Alternatively, the membrane 420 comprises any other suitable geometrical form.

An advantage of this embodiment may be that the MEMS device 400 yields an increased sensitivity because the sound signal is sensed along the whole perimeter of the membrane 420. For example, the MEMS device 400 may be advantageous for high mechanical sensitivity applications.

Figure 5A:
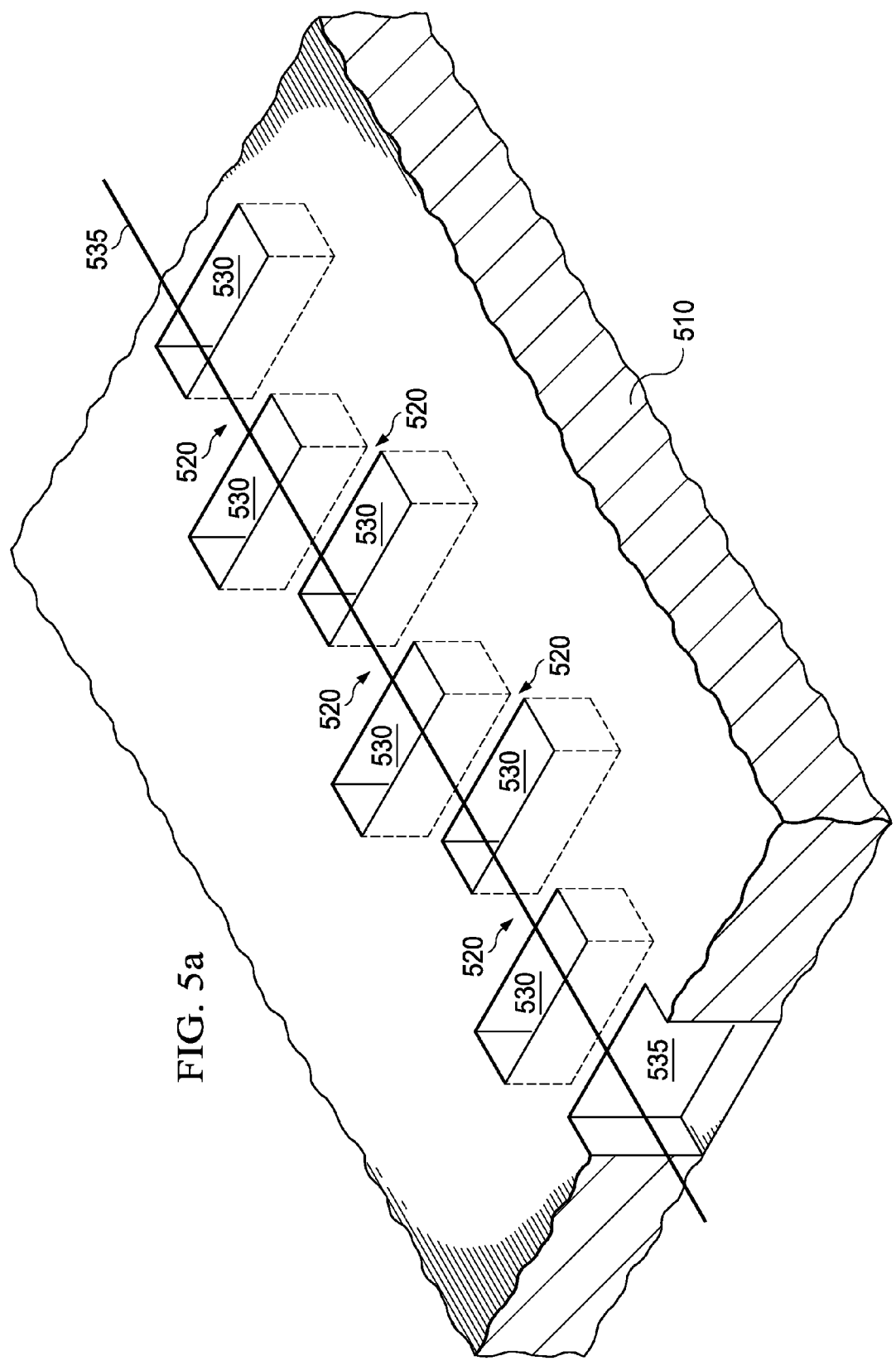
FIGS. 5a-5j show an embodiment of a method to manufacture a MEMS device.
Figure 5B:
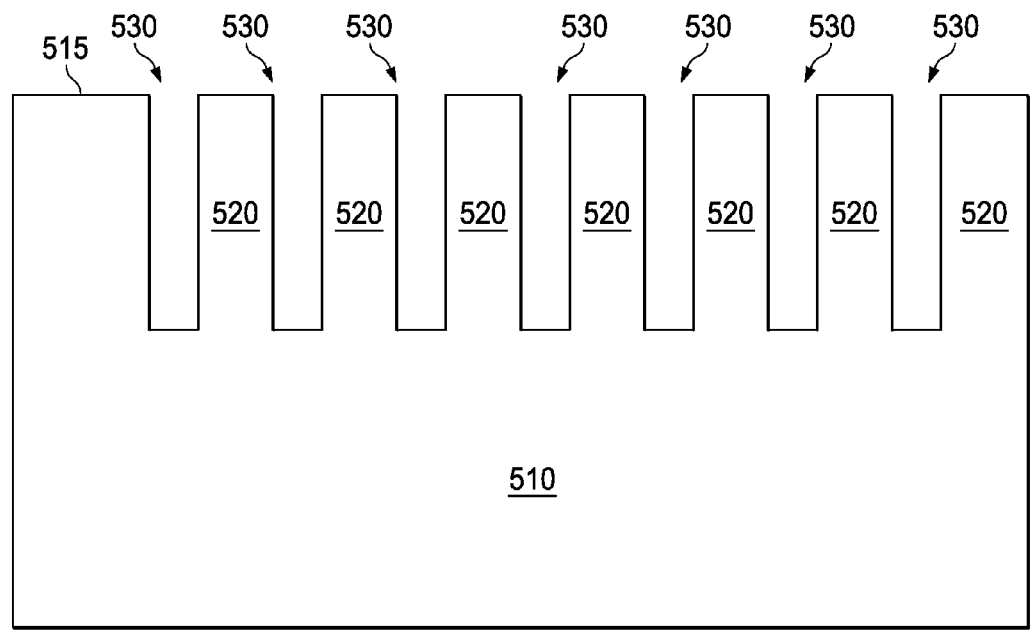

FIGS. 5a-5j show an embodiment of a method of forming a MEMS device. In a first step, as shown in FIGS. 5a and 5b, trenches 530 are formed in a first main surface of the substrate 510. The substrate 510 may comprise a semiconductive material such as silicon or germanium, or a compound semiconductor such as SiGe, GaAs, InP, GaN or SiC. Alternatively, the substrate may comprise organic materials such as glass or ceramic. The substrate 500 may be a wafer.

The trenches 530 may be etched in a first main surface 515 of the substrate 510. The trenches 530 may be etched applying a wet etch chemistry or a dry etch chemistry. For example, the trenches 530 may be etched applying RIE. The trenches 530 may be staggered with respect to line 535. The line 535 separates the stator from the membrane. The trenches 530 are separated by rims or fins 520.

Figure 5C:
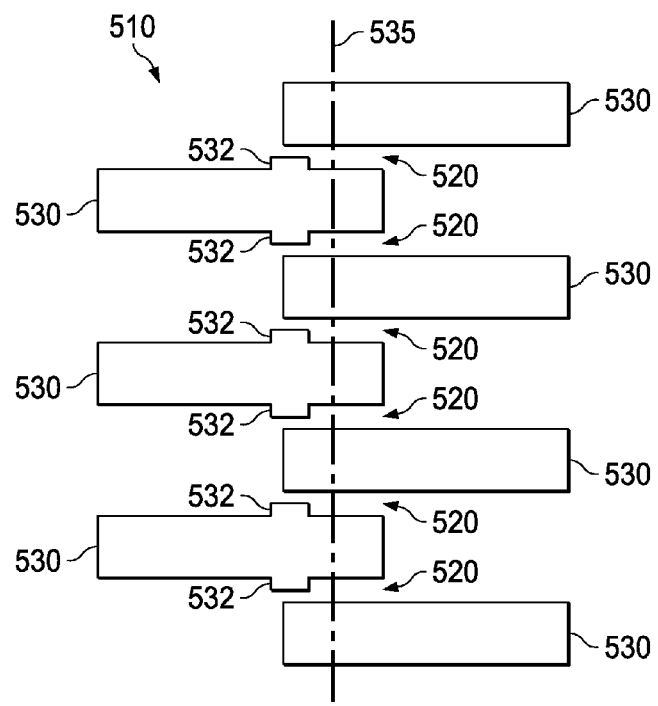

Referring now to FIG. 5c, in various embodiments, the trenches 530 may comprise sidewall structures 532 such as extensions, cut outs or notches. The sidewall structures 532 may eventually form anti-sticking structures such as anti-sticking bumps on the fingers. The sidewall structures 532 may comprise a square shape, oval shape, rectangular shape or triangle shape. Alternatively, the sidewall structures 532 may comprise any geometrical structure which is configured to reduce a contact area when neighboring fingers touch each other. The sidewall structures 532 may be placed on one sidewall of the trench. Alternatively, the sidewall structures 532 may be placed on two or three sidewalls of the trench. In some embodiments, two or more sidewall structures 532 are placed on a sidewall instead of just one.

The sidewall structures 532 may be placed on some of the trenches but not on others. For example, the sidewall structures 532 may be placed only in the trenches which eventually develop into stator fingers or may be placed in the trenches which eventually develop into membrane fingers. Alternatively, the sidewall structures 532 are placed in all trenches. The sidewall structures 532 may be formed over the entire height of the trench. Alternatively, the sidewall structures 532 may be formed over a portion of the height of the trenches. The sidewall structures 532 may be a design choice and structured in the photoresist layer before forming the trenches. FIG. 5c shows a top view of an embodiment of these sidewall structures 532.

Figure 5D:
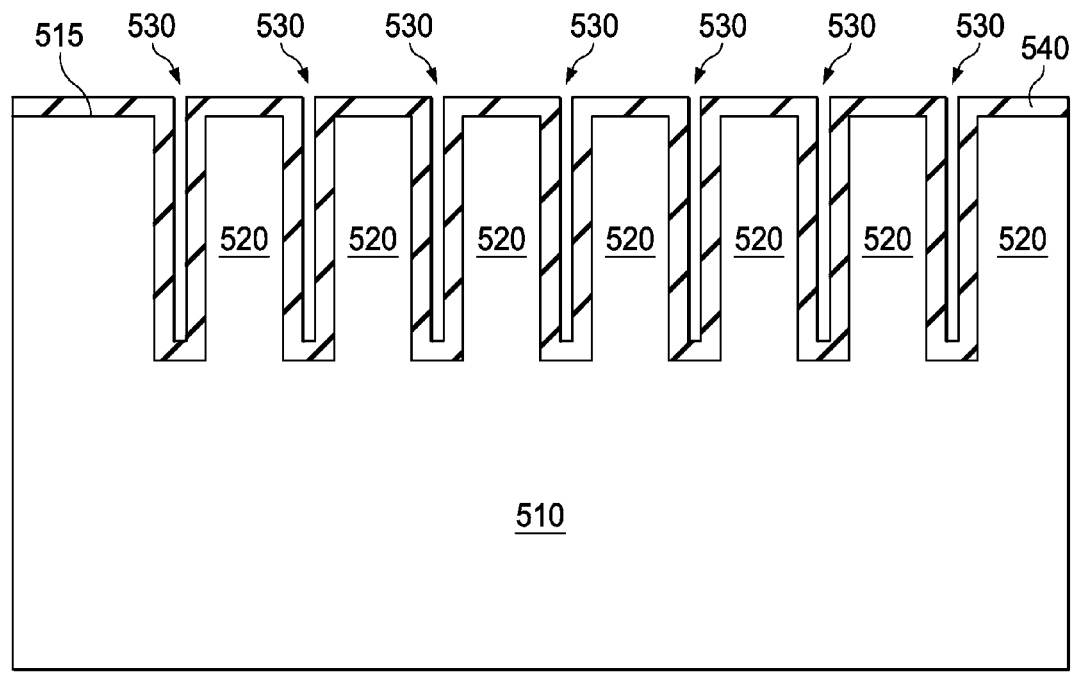

In the next step, shown in FIG. 5d, the bottom surface and the sidewalls of the trenches 530 and the top surface of the substrate 510 is covered with an insulating layer 540. The insulating layer 540 may comprise an oxide layer, a nitride layer and/or an oxynitride layer. For example, the insulating layer 540 may be a silicon oxide or TEOS. Alternatively, the insulating layer 540 may be a silicon nitride layer. The insulating layer 540 may be deposited or grown as a conformal layer. The insulating layer 540 may be deposited such that the insulating layer 540 covers only the bottom surface and the sidewalls of the trenches 530 but not a central portion of the trenches 530. In one embodiment the trenches 530 are partially filled with the insulating layer 540. In one embodiment the insulating material of the insulating layer 540 may be deposited with applying a CVD process, a PVD process, an ALD process or a wet oxidation of the substrate 510.

Figure 5E:
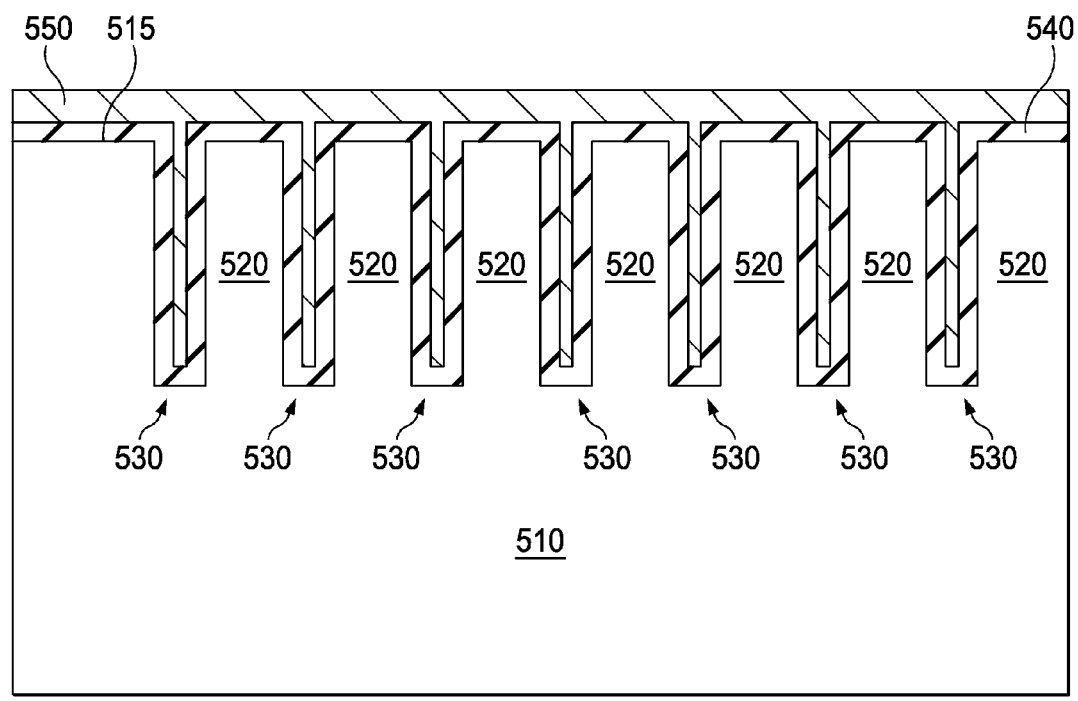

In the next step, shown in FIG. 5e, a finger material 550 may be formed in the trenches 530. The finger material 550 may be a conductive material 550. In an embodiment, the conductive material 550 may fill (e.g. completely fill) the trenches. The conductive material may be a metallic material. The metallic material may comprise a pure metal, an alloy and/or a compound. The metallic material may, for example, comprise one or more of the elements chosen from the group consisting of Al, Cu, Ni and Si. Examples, include pure aluminum, aluminum alloy, aluminum compound, pure copper, copper alloy, copper compound, pure nickel, nickel alloy and nickel compound. Examples include AlSiCu. The conductive material 550 may comprise a conductive polymer. The conductive material 550 may comprise a doped semiconductor such as doped silicon. The doped silicon may comprise doped polysilicon and/or doped monocrystalline silicon. The doped silicon may be in situ doped. The conductive material 550 may be deposited in different ways such as sputtering, PVD, CVD or ALD. The conductive material may be deposited as a single step (for example, the trenches may be filled (e.g. completely filled) or in two or more steps. When the conductive material 550 comprises a metallic material, it is possible that the conductive material 550 is deposited by a galvanic deposition. The conductive material 550 may be directly deposited onto the insulating layer 540.

Figure 5F:
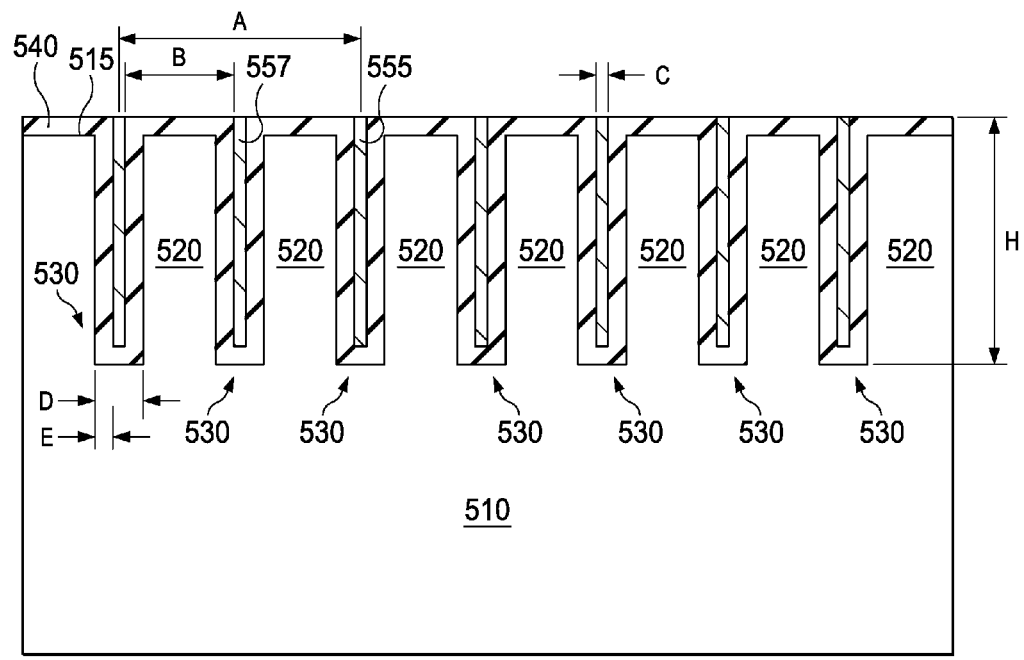

FIG. 5f shows an embodiment having specific dimensions. The finger material may be removed from over the top surface of the substrate of the insulating layer 540. The finger material 550 (e.g. the conductive material 550) forms fingers for the stator and the membrane. For example, the fingers may be stator fingers 555 and membrane fingers 557. Two stator fingers 555 may have a membrane finger 557 in between them and two membrane fingers 557 may have a stator finger 555 in between them. Two stator fingers 555 are spaced apart by a pitch A and the two membrane fingers 557 are spaced apart by the pitch A. Two neighboring fingers 555,557 may be spaced apart by a spacing B and each finger may comprise thickness C. In one embodiment half a pitch A is calculated as the spacing B+thickness C.

In one embodiment the fingers 555, 557 may comprise a height H of about 8 µm to about 12 µm, e.g., about 10 µm. The pitch A may be about 4 µm to about 6 µm, e.g., about 5 µm. The spacing B may be about 1 µm and about 2 µm, e.g., about 1.5 µm, and the thickness C may be about 0.5 µm to about 2 µm, e.g., about 1 µm. The thickness D of the trench 530 may be about 1 µm and about 2 µm, e.g., about 1.5 µm. And the thickness E of the insulating layer 540 may be about 0.1 µm to about 0.5 µm, e.g., about 0.25 µm.

Figure 5G:
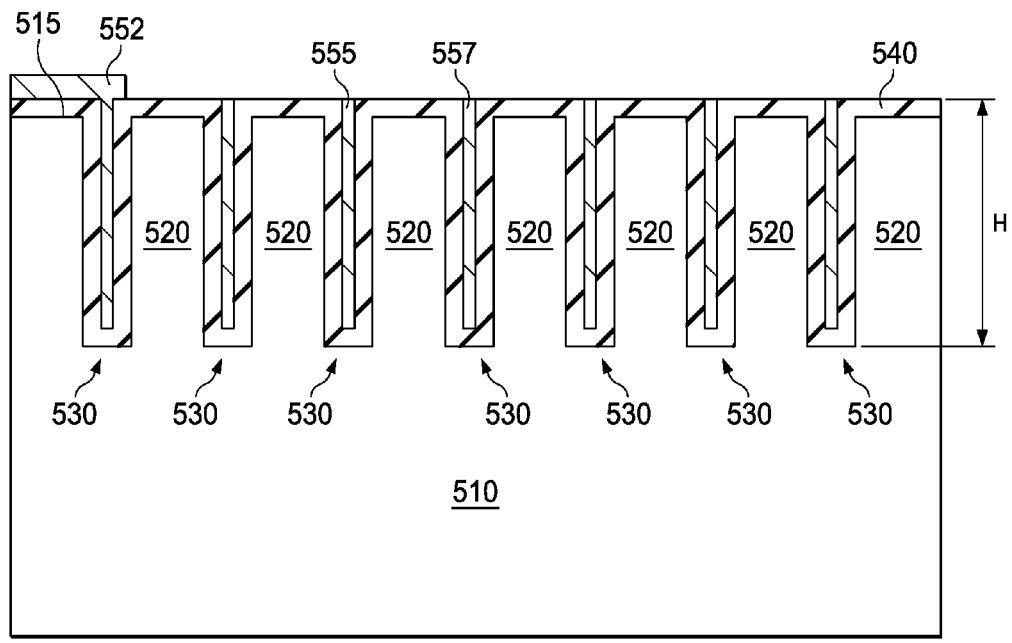

Then the conductive material 550 may be removed and pads 552 may be formed as shown in FIG. 5g. In one embodiment a photoresist is disposed over the conductive material 550 and then structured. The exposed portions of the conductive material 550 are then removed. The conductive material 550 may be etched down to the insulating layer 540. The conductive material 550 disposed in the trenches 530 may not be removed. The conductive material 550 in the trenches may form fingers 555, 557. The conductive material 550 may be removed applying a wet etch or a dry etch chemistry. For example, when the conductive material 550 comprises a semiconductor (e.g. a doped semiconductor such as doped silicon), the conductive material 550 may be etched with KOH or acid solutions of $HNO_3$ plus HF. In another embodiment a plasma process with chlorine or fluorine delivered by $SF_6$ or $Cl_2$ may be used.

The etch process may be stopped when the top surface of the insulating layer 540 is reached. The etch process is stopped either by end point detection or by timing (the layer thickness of the insulating layer 540 is much lower than the depth of the fingers).

Then pads 552 may be formed. The pads 552 may be formed in or on the substrate 520. The pads 552 can be disposed according to design specifications (e.g., practically anywhere on the top surface of the substrate 520). The pads 552 may comprise the conductive material 550. Alternatively, the pads 552 may be silicided at the pad 552 location. The silicided pads may formed by forming a metallic material on the conductive material (550). The metallic material may include one or more of the elements from the group consisting of Ni, Co, and Ti. The conductive material 550 and the metallic material may be annealed to form the silicide. In some embodiments the pads 552 are passivated.

Figure 5H:
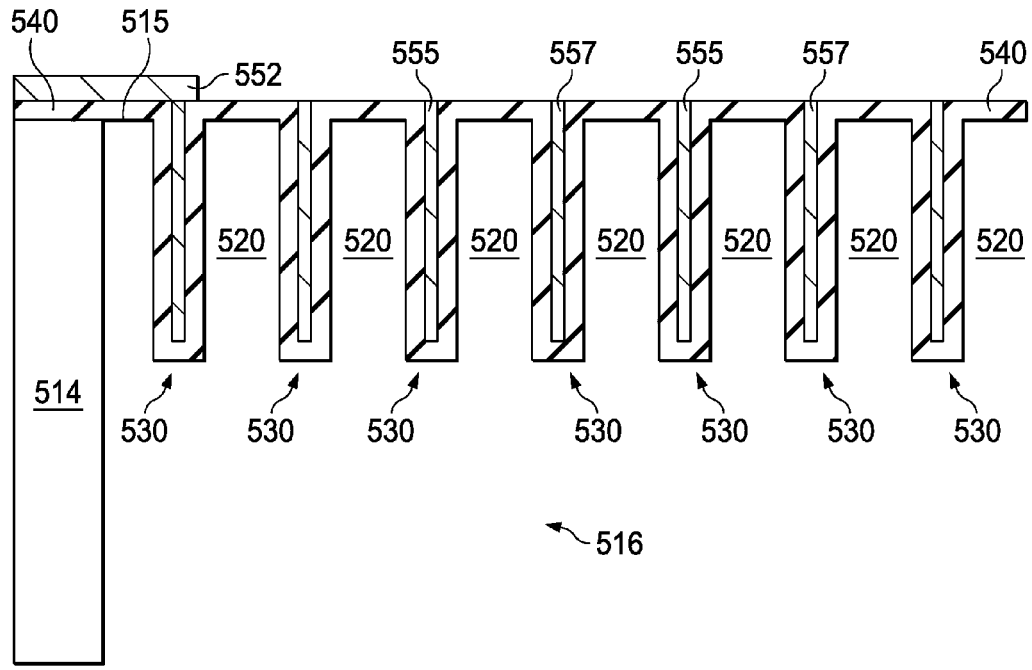

As shown in FIG. 5h, the substrate 510 is then etched from the second main surface. The substrate 510 is etched with a directional etch. For example, the substrate 510 is etched with a Bosch® etch. The backside etch is applied such that the substrate 510 is removed under the membrane 516 and that the substrate remains under the stator and the support 514. The backside etch is stopped by the insulating layer 540. The fingers 555, 557 encoded with the insulating layer 540 remain standing and are not etched.

Alternatively, the substrate backside is etched with a wet etch comprising, for example, KOH. In another embodiment the substrate backside is etched with a combination of dry etch to the level of the trenches and subsequent wet etching with a higher selectivity of e.g. substrate (e.g., silicon) etching against the insulating layer (e.g., stopping etch layer of oxide) etching.

Figure 5I:
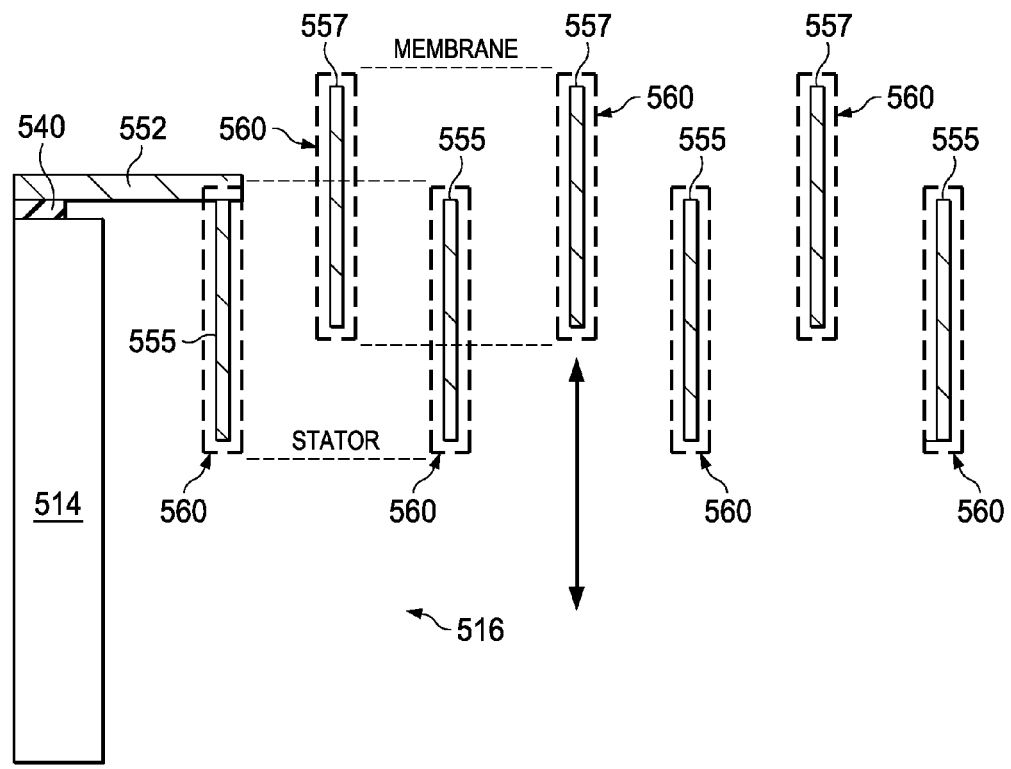

In the next step shown in FIG. 5i the insulating layer 540 is removed. The insulating layer 540 is removed with a wet etch or a dry etch. For example, the insulating layer 540 is etched applying using a HF based solution or vapor. Then the fingers 555, 557 are coated with an anti-sticking coating 560. For example, the anti-sticking coating 560 is deposited by vapor phase or gas phase deposition. Alternatively, the anti-sticking coating 560 is deposited applying a wet deposition such as a spin on coating. The anti-sticking coating 560 may comprise hydrophobic layer. The anti-sticking coating 560 may be a monolayer. For example, the anti-sticking coating 560 may comprise alkylsilane or a perhaloalkylsilane. Alternatively, the anti-sticking coating 560 may comprise HDMS (Hexamethyldisilazane) or SAM (self-assembling monolayers) based on octadecyltrichlorosilance (OTS) or perflourodecyltrichlorosilance (FDTS).

In various embodiments, the anti-sticking coating is a single layer or a plurality of layers. Alternatively, the anti-sticking coating comprises anti-sticking bumps. The anti-sticking bumps may be protruding from the fingers 555, 557 surface having a tip in the middle or to the side of each bump. In one embodiment the anti-sticking coating may comprise a combination of an anti-sticking layer and anti-sticking bumps. For example, the combination may be disposed on all fingers. Alternatively, the anti-sticking layer(s) may be disposed on the stator fingers 555 (or membrane fingers 557) and the anti-sticking bumps are disposed on the membrane fingers 557 (stator fingers 555). The stator fingers 555 and the membrane fingers 557 may be coated with a different type of anti-sticking coating 560 materials or with the same type of anti-sticking coating 560 materials.

In various embodiments, the stator fingers 555 and/or membrane fingers 557 comprise the anti-sticking coating and no anti-sticking structures (step in FIG. 5c is omitted). In alternative embodiments the stator fingers 555 and/or the membrane fingers 557 comprise the anti-sticking structures and no anti-sticking coating (the coating step in FIG. 5i is omitted). In further embodiments the stator fingers 555 and/or the membrane fingers 557 comprise the anti-sticking coating and the anti-sticking structures. In yet other embodiments, some fingers comprise the anti-sticking coating and the other fingers comprise the anti-sticking structure. Any combination of anti-sticking coating and anti-sticking structure is possible.

Figure 5J:
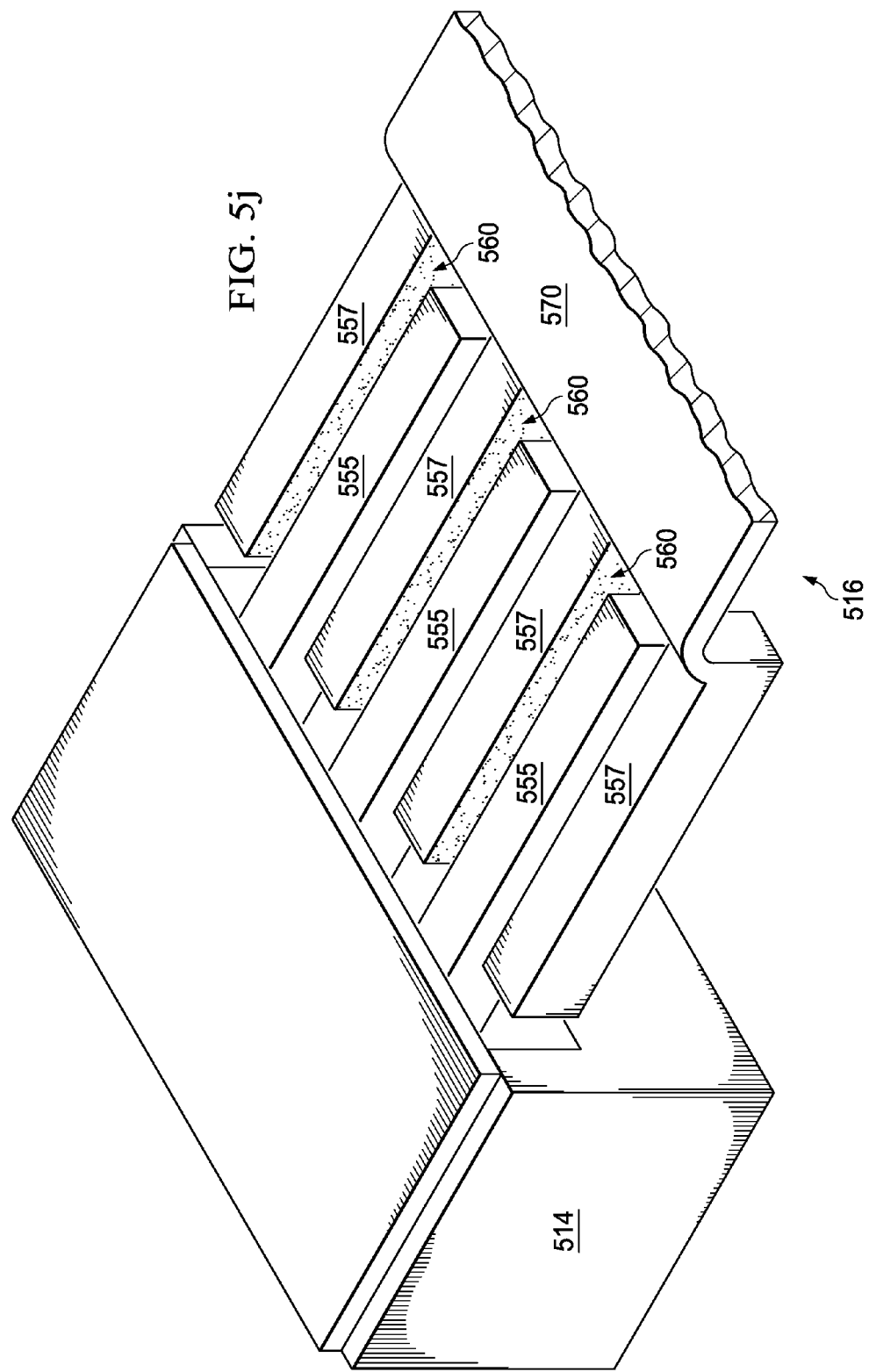

FIG. 5j shows an embodiment of a MEMS device according to the manufacturing process described with regard to FIGS. 5a-5i. The stator fingers 555 disposed on the stator 514 may be interlocked or interdigitated with the membrane fingers 557 in the membrane 570. A cavity 516 is located underneath the membrane 570 so that the membrane 570 can move up and down relative to the stator 514.

Figure 6A:
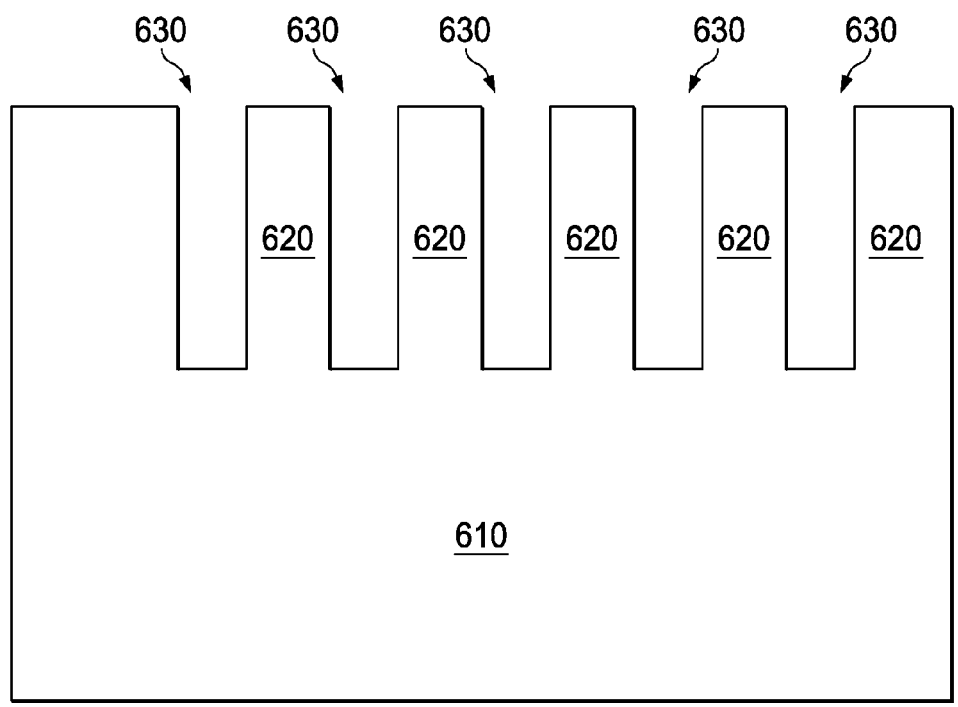
FIGS. 6a-6m show another embodiment of a method to manufacture a MEMS device.

FIGS. 6a-6m show another embodiment of a method of making a MEMS device. In a first step, as shown in FIGS. 6a, trenches 630 are formed in a first main surface of the substrate 610. The substrate 610 may comprise a semiconductive material such as silicon or germanium, or a compound semiconductor such as SiGe, GaAs, InP, GaN or SiC. Alternatively, the substrate 610 may comprise organic materials such as glass or ceramic. The substrate 610 may be a wafer.

The trenches 630 may be etched into substrate 610. The trenches 610 may be etched applying a wet etch chemistry or a dry etch chemistry. For example, the trenches 630 may be etched applying RIE. The trenches 630 are separated by rims or fins 620. In one embodiment the trenches are wide and the rims or fins 620 are narrow.

Figure 6B:
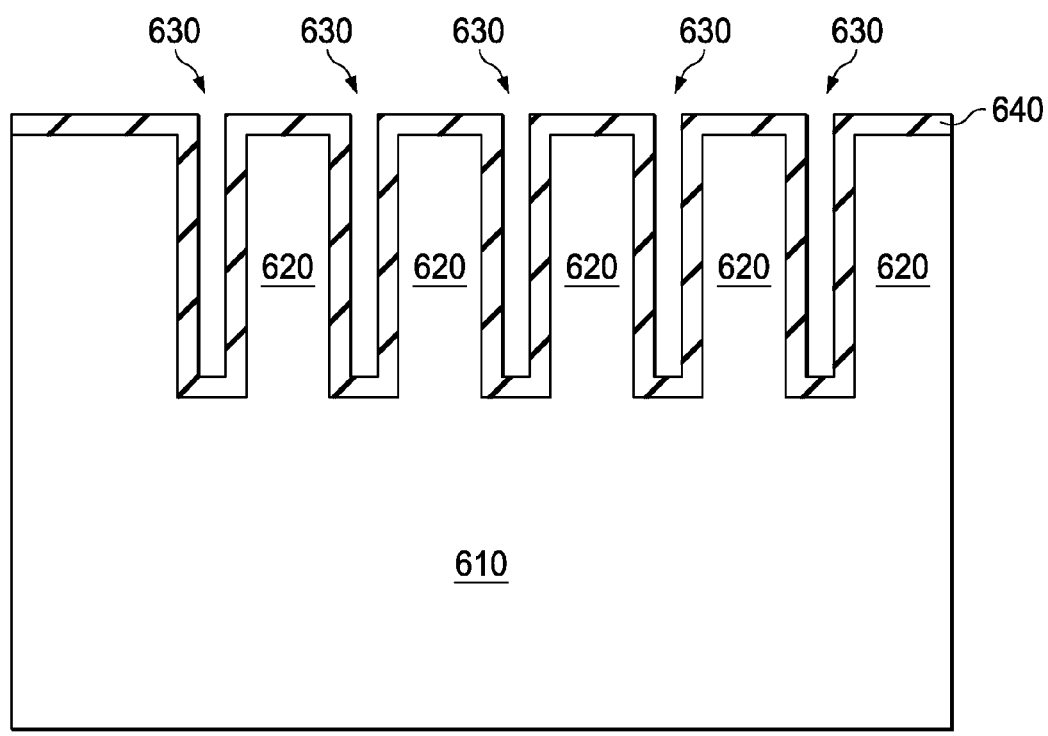

In the next step, shown in FIG. 6b, the bottom surface and the sidewalls of the trench 630 and the top surface of the substrate 610 are covered with an insulating layer 640. The insulating layer 640 may be an oxide layer or a nitride layer. For example, the insulating layer 640 may be a silicon oxide or TEOS. The insulating layer 640 may be a conformal layer. The insulating layer 640 may be deposited such that the insulating layer 640 covers only the bottom surface and the sidewalls of the trench 630 but not a central portion of the trench 630. In one embodiment the trenches 630 are partially filled with the insulating layer 640. In one embodiment, the insulating layer 640 may be deposited with a CVD process, a PVD process or an ALD process.

Figure 6C:
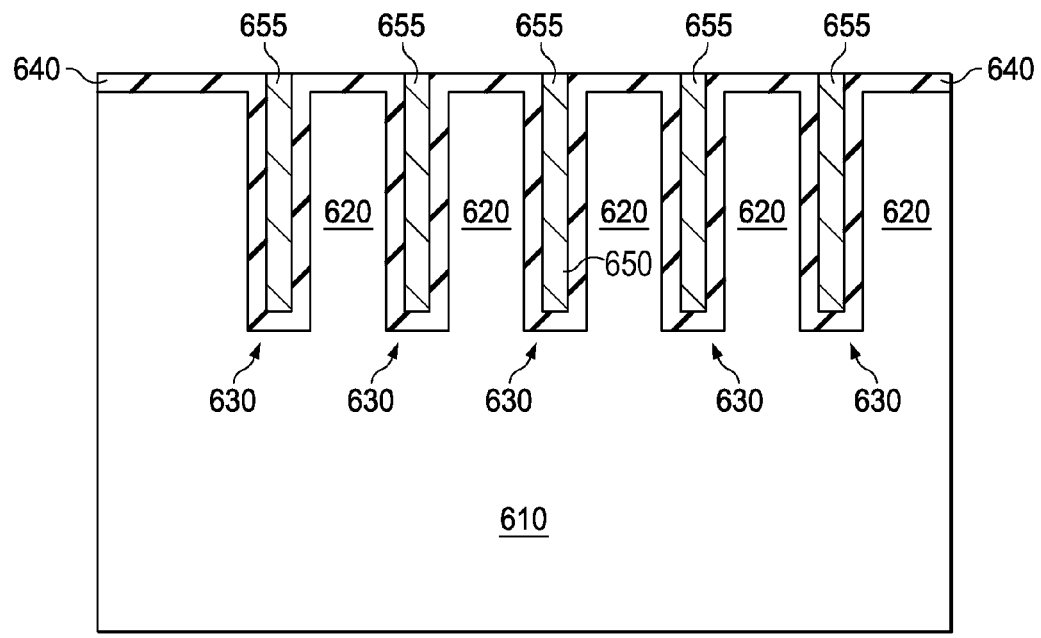

As shown in FIG. 6c, the trenches 640 are filled with a semiconductive material 650. For example, the trenches 630 are filled with polysilicon or in situ doped polysilicon. Alternatively, the trenches 630 are filled with a metal or otherwise conductive material. The trenches 630 are completely filled in a single step or in a plurality of steps. The conductive material 650 may completely cover the insulating layer 640. The conductive material 650 may be directly disposed on the insulating material 640. The conductive material 650 may be removed from over the top surface of the insulating layer 640 so that individual conductive fingers 655 are formed in the trenches 630. The fingers 655 may be stator fingers or membrane fingers.

The trenches 630 are completely filled in a single step or in a plurality of steps by conformal coating such as CVD or ALD. Alternatively, the trenches 630 are filled with a metal 650 such as Al, AlSiCu, or Ni via sputtering or galvanic deposition or an otherwise conductive material. The conductive material 650 may be directly disposed on the insulating layer 540 and may completely cover the insulating layer 640.

Figure 6D:
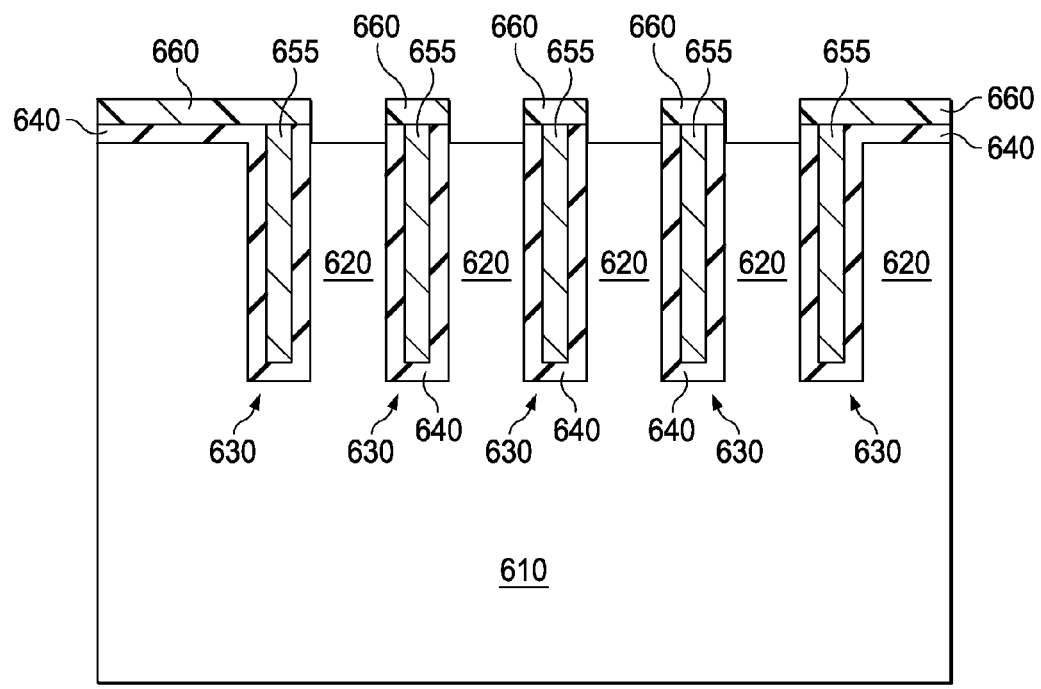
Figure 6E:
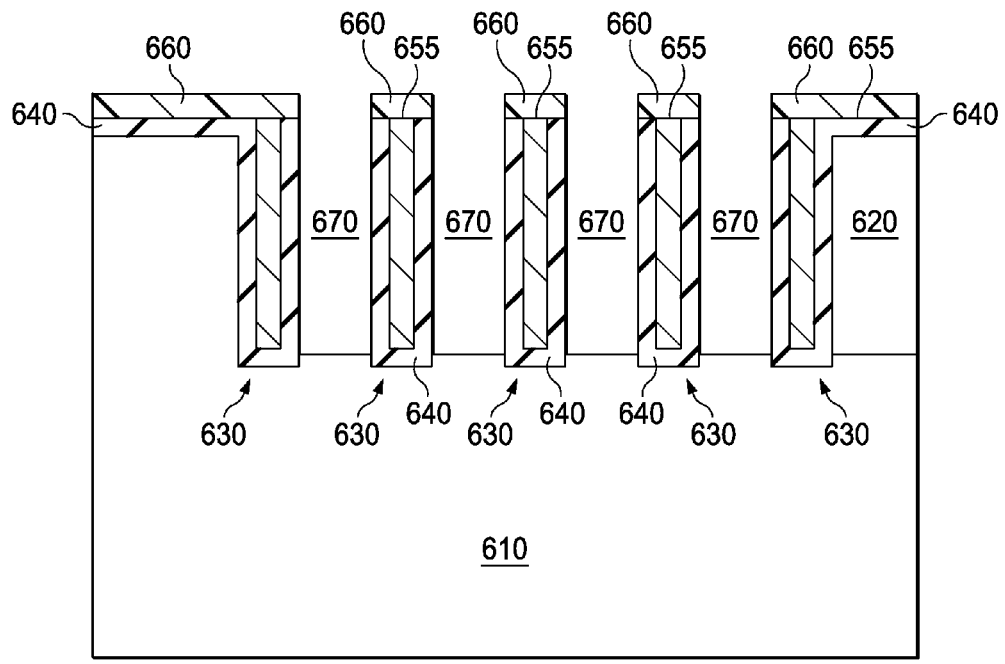

In the next step, shown in FIG. 6d, a resist 660 is formed over the substrate 610. The resist 660 is structured such that the resist 660 is opened over the rims or fins 620. The resist 660 remains over the trenches 630. The insulating layer 640 is removed over the top surface of the rims or fins 620 but not over or in the trenches 630. The insulating layer 640 is removed by an anisotropic etch. For example, the insulating layer 640 is removed by a plasma etch such as $CF_4/CHF_3$. Next, the rims and fins 620 are removed forming trenches 670. The rims and fins 620 may be removed down to the bottom surface of the trench 630. The rims and fins 620 may be etched with an anisotropic or isotropic etch. The etch process may be a dry etch process or a wet etch process. For example, the etch process comprises KOH or acid solutions of $HNO_3$ plus HF, a plasma process with chlorine or fluorine delivered by $SF_6$ or $Cl_2$. This is shown in FIG. 6e.

Figure 6F:
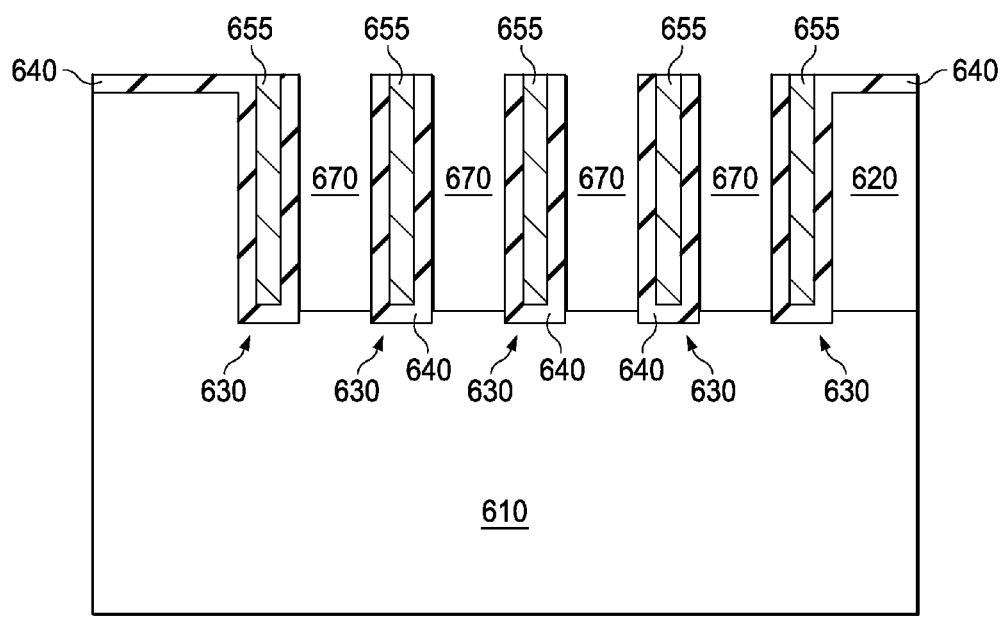
Figure 6G:
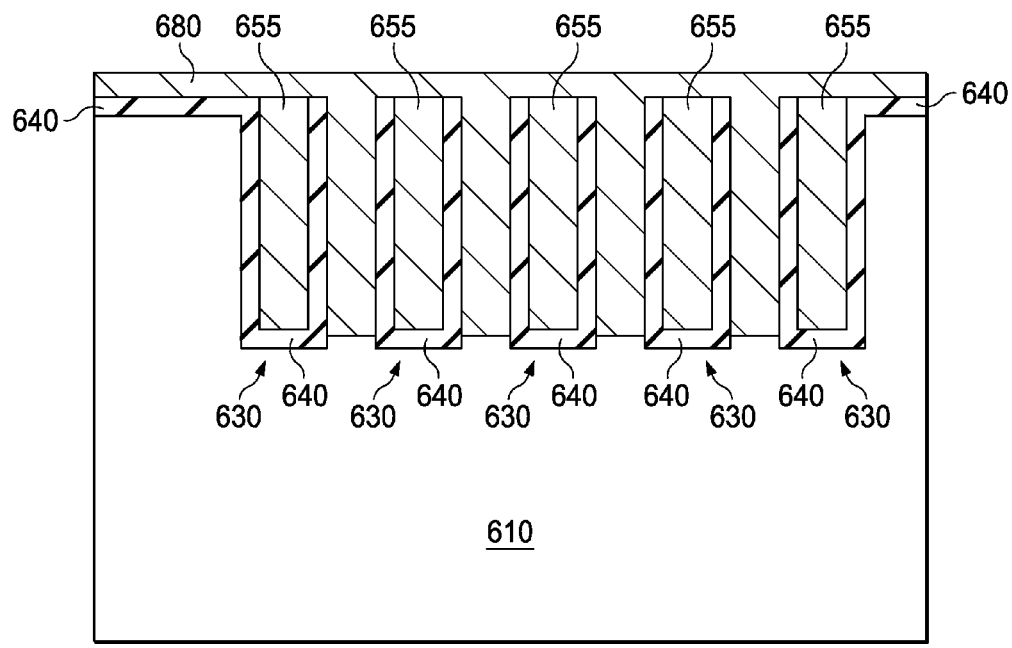
Figure 6H:
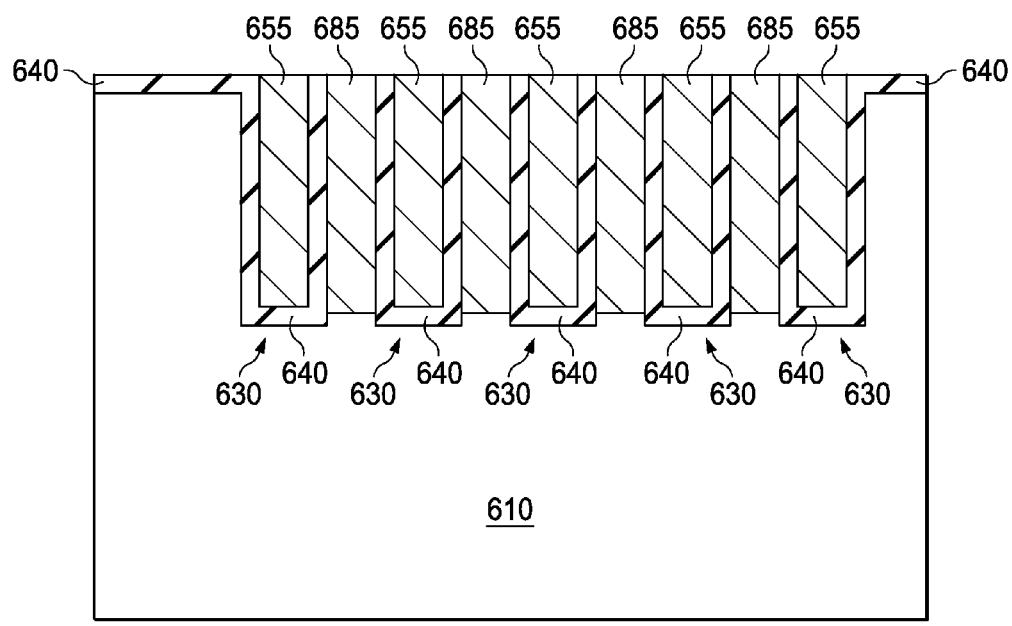

Then, as shown in FIGS. 6f-6h, the resist 660 is removed and the trenches 670 are filled with a semiconductive material 680. For example, the trenches 670 are filled with polysilicon or in situ doped polysilicon. Alternatively, the trenches 670 are filled with a metal or otherwise conductive material. The trenches 670 are completely filled in a single step or in a plurality of steps. The conductive material 680 may completely cover the insulating layer 640 and the conductive material 655. In a subsequent step the conductive material 680 may be removed from over the top surface of the insulating layer 640 so that individual conductive fingers 685 are formed in the trenches 670. The conductive fingers 655 may comprise the same conductive material or a different conductive material as the conductive fingers 685.

Figure 6I:
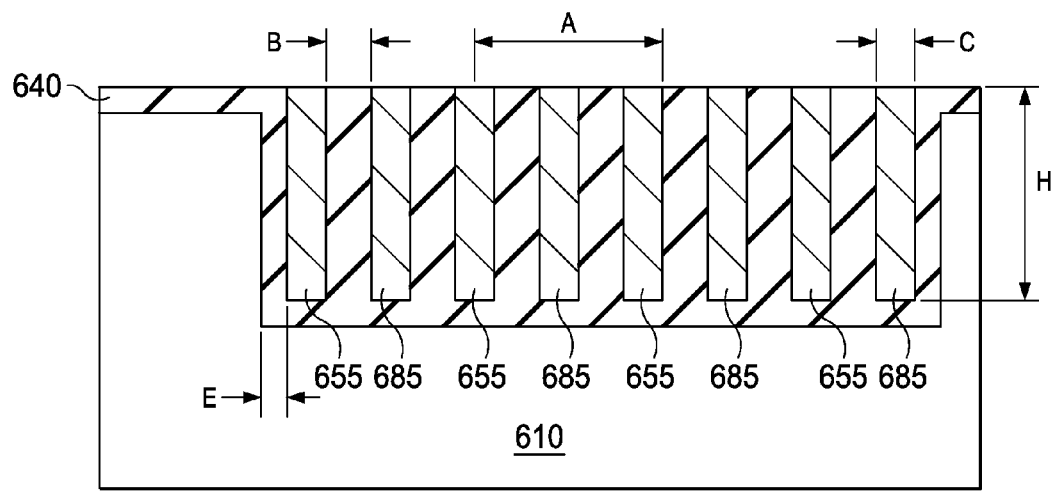

FIG. 6i shows an embodiment having specific dimensions. Two stator fingers have a membrane finger in between and two membrane fingers have a stator finger in between. Two stator fingers are spaced apart by a pitch A and the two membrane fingers are spaced apart by the pitch A. Two neighboring fingers may be spaced apart by a spacing B and each finger may comprise thickness C. In one embodiment half a pitch A is calculated as the spacing B +thickness C.

In one embodiment the fingers comprise a height H of about 8 µm to about 12 µm, e.g., about 10 µm. The pitch A may be about 3 µm to about 5 µm, e.g., about 4 µm. The spacing B may be about 0.5 µm and about 2 µm, e.g., about 1 µm, and the thickness C may be about 0.5 µm to about 2 µm, e.g., about 1 µm. And the thickness E of the insulating layer may be about 0.1 µm to about 0.5 µm, e.g., about 0.25 µm.

Then pads may be formed. The pads may be formed as described with respect to FIG. 5g.

Figure 6J:
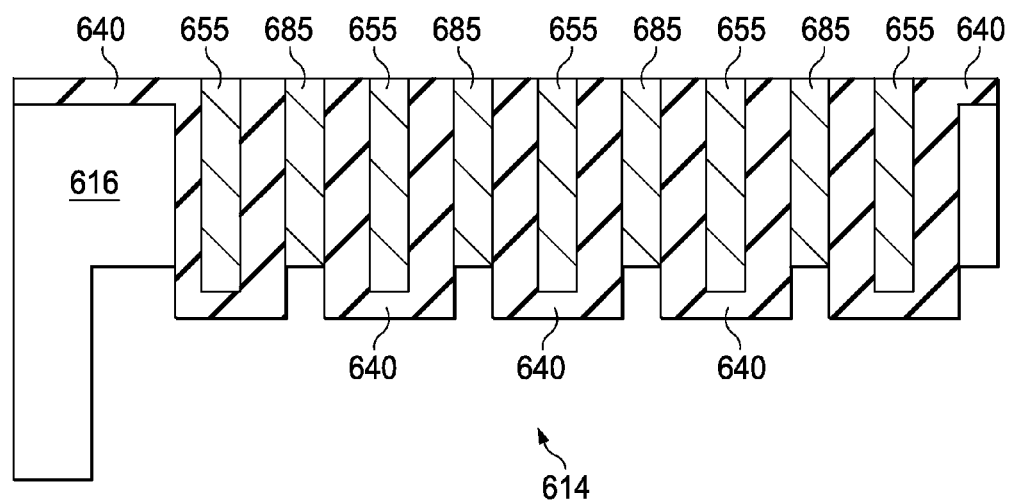

The substrate 610 is then etched from the second main surface. The substrate 610 is etched with a directional etch. For example, the substrate 610 is etched with a Bosch® etch. The backside etch is applied such that the substrate 610 is removed along a length of the membrane 614 and that the substrate 610 remains standing at the stator and support 616. The backside crates a cavity 614 beneath the membrane. The etch process is stopped by the insulating layer 640 and the fingers 655, 685. This is shown in FIG. 6j.

Figure 6K:
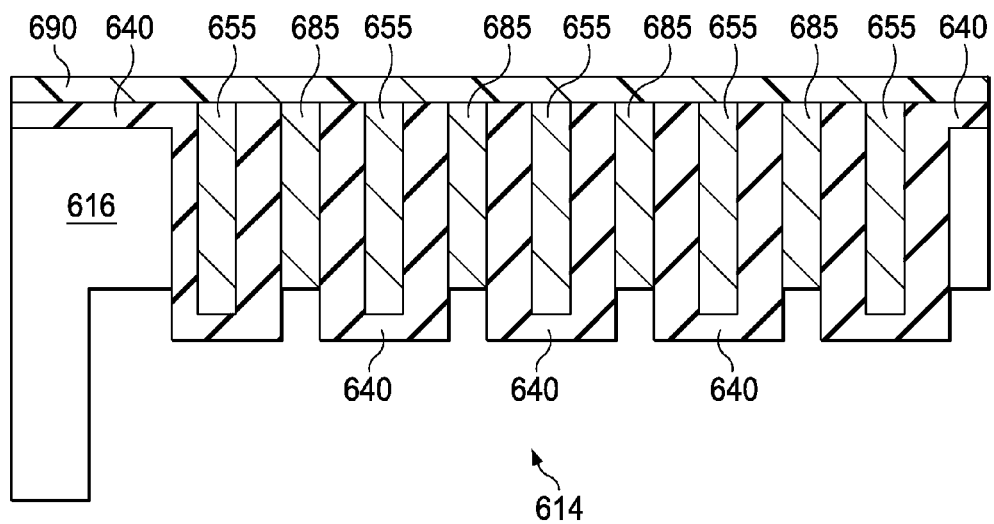
Figure 6L:
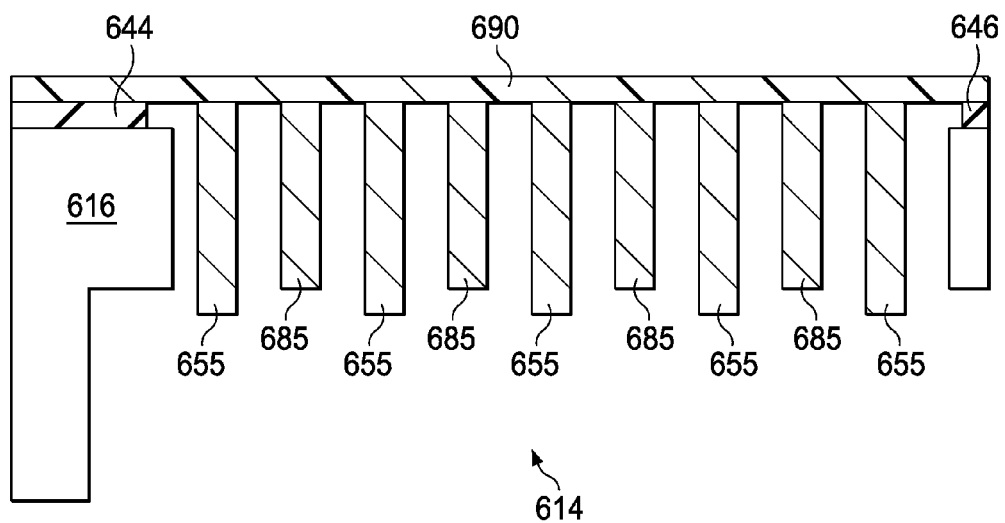
Figure 6M:
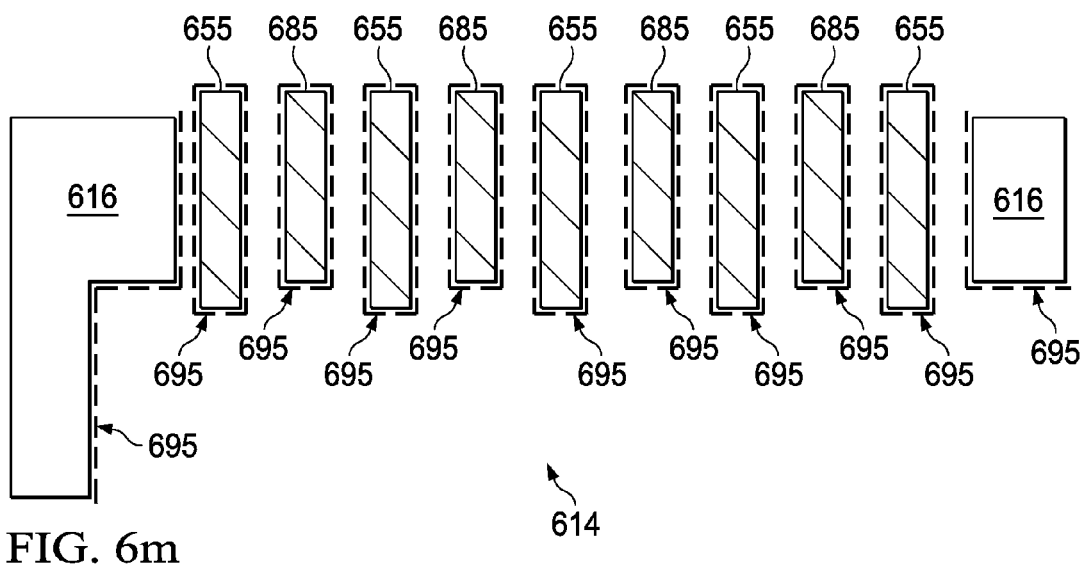

As shown in FIG. 6k, a protection layer or a material layer 690 is disposed on the first main surface of the substrate 610. The protection layer 690 may be a negative photoresist or a positive photoresist. The protection layer 690 is configured to protect the front side or main surface. In the next step, as shown in FIG. 6l, the insulating layer 640 is removed such that the fingers 655, 685 are free standing. The insulating layer 640 is removed with a wet etch or a dry etch. For example, the insulating layer 640 is etched applying a buffered HF, HF vapor or gas phase.

Then the fingers 655, 685 are coated with an anti-sticking coating 695. For example, the anti-sticking coating 695 is deposited by vapor phase or gas phase deposition. Alternatively, the anti-sticking coating 695 is deposited applying a wet deposition such as a spin on coating. The anti-sticking coating 695 may comprise hydrophobic layer. The anti-sticking coating 695 may be a monolayer. For example, the anti-sticking coating 695 may comprise alkylsilane or a perhaloalkylsilane. Alternatively, the anti-sticking coating 695 may comprise HDMS (Hexamethyldisilazane) or SAM (self-assembling monolayers) based on octadecyltrichlorosilance (OTS) or perflourodecyltrichlorosilance (FDTS).

In one embodiment the anti-sticking coating is a single layer or a plurality of layers. Alternatively, the anti-sticking coating comprises anti-sticking bumps. The anti-sticking bumps may be protruding from the conductive fingers 655, 685 surface having a tip in the middle or to the side of each bump. In one embodiment the anti-sticking coating 695 may comprise a combination of an anti-sticking layer and anti-sticking bumps. For example, the combination may be disposed on all fingers 655, 685. Alternatively, the anti-sticking layer(s) may be disposed on the stator fingers (or membrane fingers) and the anti-sticking bumps are disposed on the membrane fingers (stator fingers). The stator fingers and the membrane fingers may be coated with a different type of anti-sticking coating materials or with the same type of anti-sticking coating material.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for making a MEMS device, the method comprising:
    forming trenches in a first main surface of a substrate;
    depositing a conductive material, wherein depositing the conductive material comprises
        forming a membrane layer from a first portion of the conductive material outside the trenches and on a first portion of the first main surface of the substrate, the membrane layer having a first layer thickness, wherein the membrane layer on the first portion of the first main surface of the substrate comprises a deflectable membrane, and
        forming a finger layer from a second portion of the conductive material in the trenches, the finger layer having a second layer thickness that is greater than the first thickness, wherein the finger layer comprises conductive fingers formed in the trenches; and
    forming an opening from a second main surface of the substrate thereby exposing the conductive fingers and the membrane, the second main surface opposite to the first main surface.

2. The method according to claim 1, further comprising forming an anti-sticking coating over the conductive fingers.

3. The method according to claim 2, wherein the anti-sticking coating comprises hexamethyldisilazane (HDMS)

or a self-assembling monolayer (SAM) based on octadecyltrichlorosilance (OTS) or perflourodecyltrichlorosilance (FDTS).

4. The method according to claim 2, wherein the anti-sticking coating comprises a hydrophobic monolayer.

5. The method according to claim 1, further comprising forming structures in sidewalls of the trenches.

6. The method according to claim 5, wherein each trench comprises a first structure in a first sidewall and a second structure in a second sidewall.

7. The method according to claim 5, wherein only every other trench comprises structures in the sidewalls.

8. The method according to claim 1, further comprising forming an insulating layer on a bottom and sidewall surfaces of the trenches before forming the conductive fingers.

9. The method according to claim 8, wherein forming the opening from the second main surface comprises:
 performing a first etch process to remove a portion of the substrate; and
 performing a second etch process to remove the insulating layer around the conductive fingers, the first etch process being different than the second etch process.

10. The method according to claim 1, wherein forming the conductive fingers comprises forming polysilicon in the trenches.

11. The method according to claim 10, wherein forming the conductive fingers further comprises forming a dielectric material in the trenches.

12. The method according to claim 11, wherein forming the polysilicon and the dielectric material comprises forming a sandwich structure.

13. The method according to claim 11, wherein forming the dielectric material comprises forming silicon nitride.

14. The method according to claim 10, wherein forming polysilicon in the trenches comprises forming in-situ doped polysilicon in the trenches.

15. The method according to claim 1, wherein forming the conductive fingers comprises forming a metallic material in the trenches.

16. The method according to claim 1, wherein forming the conductive fingers comprises forming a metallic material and a dielectric material in the trenches.

17. The method according to claim 16, wherein forming the metallic material and the dielectric material comprises forming a sandwich structure.

18. The method according to claim 1, further comprising forming pads and a passivation layer on the first main surface of the substrate.

19. The method according to claim 1, wherein the membrane layer comprises a continuous unbroken layer configured as an acoustic diaphragm.

20. A method of forming a MEMS device, the method comprising:
 forming a stator comprising a first set of fingers extending in a direction parallel to a first plane;
 forming a movable element comprising a membrane with a first surface in the first plane and a second set of fingers extending from the first surface of the membrane in a direction parallel to the first plane, wherein the first set of fingers and the second set of fingers are interdigitated, and wherein the second set of fingers are formed with a layer thickness greater than the layer thickness of the membrane, the layer thickness being defined in a direction orthogonal to the first plane;
 forming an anti-sticking mechanism between the first set of fingers and the second set of fingers; and wherein forming the stator comprising the first set of fingers and forming the movable element comprising the membrane and the second set of fingers comprises
 forming the first set of fingers in a first set of trenches in a top surface of a substrate,
 forming the second set of fingers in a second set of trenches in the top surface of the substrate, and
 performing a directional Bosch etch in the substrate from a back surface of the substrate to remove portions of the substrate beneath the first set of fingers and the second set of fingers.

21. The method according to claim 20, wherein the second set of fingers is formed only on a first side of the movable element.

22. The method according to claim 20, wherein the second set of fingers is formed only on a first side and a second side of the movable element.

23. The method according to claim 20, wherein the second set of fingers is formed on all sides of the movable element or along a perimeter of the movable element.

24. The method according to claim 20, wherein the first set of fingers and the second set of fingers comprise conductive fingers.

25. The method according to claim 24, wherein the conductive fingers comprise polysilicon fingers.

26. The method according to claim 24, wherein the conductive fingers comprise metallic fingers.

27. The method according to claim 20, wherein forming the movable element comprises forming a cantilever, the cantilever comprising the membrane and the second set of fingers.

28. The method according to claim 20, wherein forming the anti-sticking mechanism comprises forming an anti-sticking coating.

29. The method according to claim 28, wherein the anti-sticking coating comprises a hexamethyldisilazane (HDMS) or a self-assembling monolayer (SAM) based on octadecyltrichlorosilane (OTS) or perflourodecyltrichlorosilance (FDTS).

30. A method of forming a MEMS device, the method comprising:
 forming a stator comprising a first set of fingers extending in a direction parallel to a first plane;
 forming a movable element comprising a membrane with a first surface in the first plane and a second set of fingers extending from the first surface of the membrane in a direction parallel to the first plane, wherein the first set of fingers and the second set of fingers are interdigitated,
 the second set of fingers are formed with a layer thickness greater than the layer thickness of the membrane, the layer thickness being defined in a direction orthogonal to the first plane, and
 forming the movable element comprises depositing a continuous conductive material to form the membrane and the second set of fingers consisting essentially of the continuous conductive material; and
 forming an anti-sticking mechanism between the first set of fingers and the second set of fingers, wherein forming the anti-sticking mechanism comprises forming an anti-sticking structure, the anti-sticking structure protruding out from at least one of the first set of fingers and the second set of fingers.

* * * * *